United States Patent [19]
Yamamoto

[11] Patent Number: 5,373,174
[45] Date of Patent: Dec. 13, 1994

[54] SEMICONDUCTOR LIGHT-EMITTING DEVICE

[75] Inventor: Yousuke Yamamoto, Itami, Japan

[73] Assignee: Mitsubishi Denki Kabushiki Kaisha, Tokyo, Japan

[21] Appl. No.: 107,077

[22] Filed: Aug. 17, 1993

[30] Foreign Application Priority Data

Aug. 18, 1992 [JP] Japan ................. 4-219254

[51] Int. Cl.[5] .............. H01L 33/00; H01L 31/16
[52] U.S. Cl. .......................... 257/88; 257/91; 257/93; 257/98
[58] Field of Search ........... 257/88, 80, 98, 79, 257/81, 82, 85, 93, 96, 95, 99, 91; 372/44, 50

[56] References Cited

U.S. PATENT DOCUMENTS

| 4,284,884 | 8/1981 | Dyment et al. | 257/82 |
| 4,303,931 | 12/1981 | Gaffre | 257/93 |
| 4,605,944 | 8/1986 | Ishii et al. | 257/93 |

FOREIGN PATENT DOCUMENTS

| 58-102590 | 6/1983 | Japan . |
| 61-184738 | 8/1986 | Japan . |
| 63-111688 | 5/1988 | Japan . |
| 1204235 | 8/1989 | Japan . |
| 297082 | 4/1990 | Japan . |

OTHER PUBLICATIONS

Kozni et al, "1.5 µm InP/GaInAsP Linear Laser Array With Twelve Individually Addressable Elements", Electronics Letters, vol. 24, No. 4, Feb. 1988, pp. 217-219.

Primary Examiner—Jerome Jackson
Assistant Examiner—Nathan K. Kelley
Attorney, Agent, or Firm—Leydig, Voit & Mayer

[57] ABSTRACT

A semiconductor light-emitting device includes a plurality of light-emitting elements disposed on a single substrate. Each light-emitting element includes a plurality of light-emitting regions that can be driven independent of each other to emit light. The largest spacing between light-emitting regions of each light-emitting element is selected such that light emitted from any of the light-emitting regions of that element can impinge on the same light-responsive element associated with that light-emitting element.

10 Claims, 10 Drawing Sheets

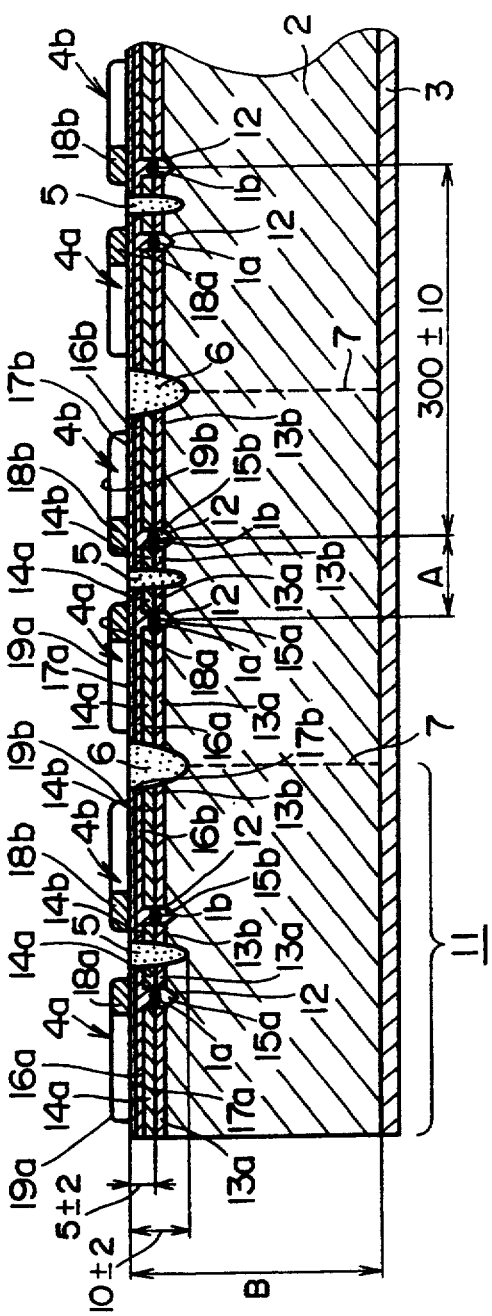
F I G. 2(a)
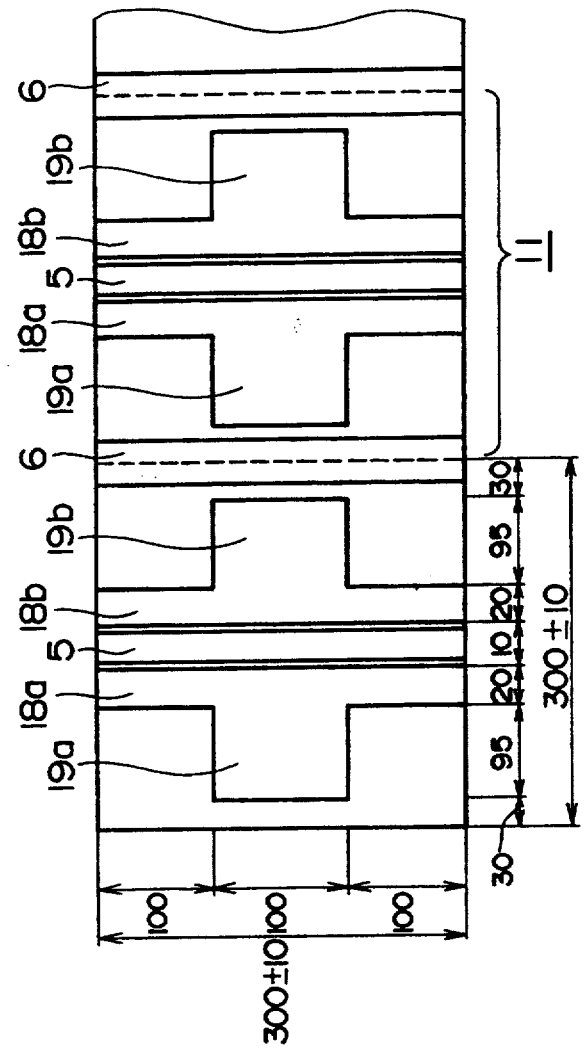
F I G. 2(b)

SEMICONDUCTOR LIGHT-EMITTING DEVICE

The present invention relates to a semiconductor light-emitting device including a plurality of light-emitting elements disposed on a single substrate.

BACKGROUND OF THE INVENTION

Data transfer between electronic computers may be achieved by means of light, such as laser light. A semiconductor laser device as shown in FIG. 1 may be frequently used as such laser light providing means, in which a plurality of light-emitting elements are disposed on a single substrate. If a laser device is of a type which emits a single light ray, a number of laser devices equal to the number of desired light rays must be provided, which requires a large space for such semiconductor laser devices and also increases the cost of the devices. Such problems can be solved by a semiconductor laser device such as the one shown in FIG. 1.

The semiconductor laser shown in FIG. 1 is shown and described in ELECTRONICS LETTERS, Vol. 24, No. 4, Feb. 18, 1988. Each one of light-emitting regions 1 is of a double-heterojunction structure and is disposed in one of light-emitting elements 8.

In operation, a forward bias is applied between a p-side electrode 4 and an n-side electrode 3 of a light-emitting element 8. Respective light-emitting elements 8 are electrically insulated from each other by separation grooves 10 disposed at boundaries 7 between adjacent elements 8. Thus, it is possible to cause respective elements to be individually excited to emit light.

Since only one light-emitting region is present for each light-emitting element 8 of the semiconductor laser device shown in FIG. 1, if even only one of a plurality of light-emitting regions 1 is found to be defective after the completion of the device, the entire semiconductor laser device must be rejected. regardless of whether the remaining light-emitting regions 1 are acceptable. Accordingly, the percentage of rejected semiconductor devices including a plurality of light-emitting elements 8 is higher than that of semiconductor lasers each including only one light-emitting element 8.

Furthermore, if any one of light-emitting elements 8 fails during operation, the semiconductor laser device including that light-emitting element must be replaced, which is not economical.

Another problem is that heat generated by each light-emitting region 1 is conducted to adjacent light-emitting elements 8 and thermally affects them. That is, heat generated by light-emitting elements 8 adversely affects the light-emitting characteristics of other elements 8.

Japanese Unexamined Patent Publication No. HEI 1-204235 discloses a semiconductor laser device including a plurality of light-emitting points on a single substrate with varying spacing between adjacent light-emitting points. If any one of the light-emitting points of a semiconductor laser device fails, another point cannot be a substitute for it, and, therefore, that laser device must be rejected.

Japanese Unexamined Patent Publication No. SHO 61-184738, Japanese Unexamined Patent Publication No. HEI 2-97082, and Japanese Unexamined Patent Publication No. SHO 63-111688 disclose semiconductor lasers including a plurality of light-emitting points which can be independently driven. However, the semiconductor laser devices also have the same problems as those associated with the above-described devices.

The present invention is to provide a semiconductor laser devices free of the above-described problems.

SUMMARY OF THE INVENTION

According to a first aspect of the present invention, a semiconductor light-emitting device includes a plurality of light-emitting elements disposed on a single substrate in such a manner as to emit light directed to associated light-responsive sections. Each of the light-emitting elements includes a plurality of light-emitting regions which can be independently driven to emit light. The spacing between the light-emitting regions is determined such that light emitted from the light-emitting regions can impinge on the light-responsive section associated with the light-emitting element to which the light-emitting regions belong.

According to a second aspect of the invention, the plurality of light-emitting regions of each light-emitting element are disposed at a location closer to one of adjacent light-emitting elements so that the ratio of intersecting dimensions of wire bonding regions for a plurality of electrodes for those light-emitting regions is closer to unity (1) and the wire bonding regions to overlie substantially the entire surface of the light-emitting element.

According to a third aspect of the present invention, a plurality of light-emitting regions of each of pairs of adjacent light-emitting elements are disposed at locations in the respective light-emitting elements of that pair close to the boundary between the two light-emitting elements.

According to a fourth aspect of the invention, a recess is formed in the surface of the substrate opposite to the surface in which the plurality of light-emitting regions are disposed, and at a location near the plurality of light emitting-regions for each light-emitting element, and a heat sink is disposed in the recess.

According to a fifth aspect of the invention, a heat sink is disposed in a recess in the opposite surface of the substrate at a location between a plurality of light-emitting regions of a light-emitting element and a plurality of light-emitting regions of an adjacent light-emitting element.

According to a sixth aspect of the present invention, a heat sink is disposed in a recess formed in the opposite surface of the substrate at a location near the light-emitting regions of each light-emitting element which are disposed closer to one of adjacent light-emitting elements.

According to a seventh aspect of the invention, a recess is formed in the opposite surface of the substrate at a location between a plurality of light-emitting regions of each light-emitting element and a plurality of light-emitting regions of an adjacent light-emitting element, and a heat sink is disposed in each recess.

Further, according to an eighth aspect of the present invention, a recess is formed in the opposite side of the substrate at a location close to a plurality of closely disposed light-emitting regions of each pair of light-emitting elements, and a heat sink is disposed in each recess.

According to the present invention, if even only one of light-emitting regions of each light-emitting element of manufactured semiconductor light-emitting device can properly operate, that light-emitting device can be accepted. That is, since each light-emitting element of the semiconductor light-emitting device of the present invention is provided with a predetermined plural number of light-emitting regions which can be individually driven and are spaced by a predetermined distance from each other so as to direct respective emitted light to impinge on an associated light-receiving section, any one of a plurality of light-emitting regions can be used.

A plurality of wire bonding regions for respective ones of a plurality of light-emitting regions of each light-emitting element are disposed on one of major surfaces of that light-emitting element. In a semiconductor light-emitting device according to the second, third, sixth, seventh or eighth aspects of the present invention, since a plurality of light-emitting regions of each light-emitting element are disposed at a location closer to one of adjacent light-emitting elements, the wire bonding region for each of a plurality of electrodes for the light-emitting regions can be so shaped as to have two orthogonal dimensions in the ratio of unity (1), and further substantially the entire surface area of each light-emitting element can be used for the wire bonding regions. Thus, bonding of wires becomes easier, and, therefore, the number of devices which could be rejected due to unacceptable bonding can be reduced.

The semiconductor light-emitting device incorporating the third or eighth aspect is so arranged that adjacent light-emitting elements are paired with a plurality of light-emitting regions are disposed close to the border between that pair of light-emitting elements. This enables close positioning of two light-receiving sections associated with each pair of light-emitting elements. For example, when light-receiving sections are cores of an optical fiber, it is possible to make respective light rays from two light-emitting elements of each pair enter respective cores in that optical fiber. Consequently, it is possible to arrange one optical fiber for a pair of light-emitting elements.

The semiconductor light-emitting device of the present invention may include a sink which can dissipate heat generated when each of light-emitting regions emits light, so that heat generated by respective light-emitting elements is not transferred to other elements. Thus, light-emitting elements are not thermally affected by other elements, and, therefore, characteristics of the respective light-emitting elements can be stabilized.

BRIEF DESCRIPTION OF THE DRAWINGS

FIGS. 2(a) and 2(b) are cross-sectional and plan views, respectively, of a semiconductor laser device according to a first embodiment of the present invention;

DETAILED DESCRIPTION OF PREFERRED EMBODIMENTS

Figure 1:
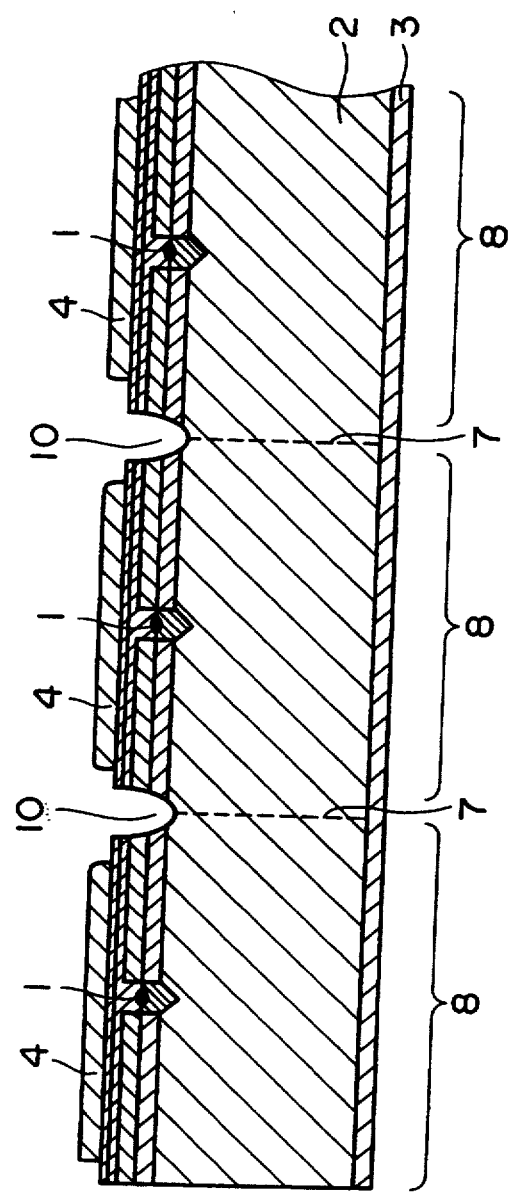
FIG. 1 is a cross-sectional view of a conventional semiconductor laser device including a plurality of light-emitting elements.

FIG. 2 shows a semiconductor laser device embodying the present invention. As shown in FIG. 2(a), the semiconductor laser device includes two or more light-emitting elements 11 (three being shown in FIG. 2(a)), which are on a single p-type InP substrate 2. Light-emitting elements 11 are identical with each other. Each of light-emitting elements 11 includes two double heterojunction light-emitting regions 1. This laser device may be used with, for example, an optical fiber system, with the end surface of the core of each optical fiber being disposed to face two light-emitting regions 1 which belong to the same one light-emitting element 11. For that purpose, the spacing between two light-emitting regions of the same light-emitting element 11 is smaller than the diameter of the core facing them. In operation, light-emitting elements 11 are independently driven, with one of two regions 1 of each light-emitting element 11 being driven to emit light.

Because the semiconductor laser device is constructed such that either one of two light-emitting regions 1 of each light-emitting element 11 can be used, if either one of the two regions is defective (e.g. its light-emitting characteristics being outside a permissible range), the other one can be used for the intended purpose. Thus, if only either one of light-emitting regions 1 of each of light-emitting elements 11 of a semiconductor laser device is operable, that device is acceptable. Accordingly, the yield of semiconductor laser devices is improved.

Furthermore, if one of two light-emitting regions 1 fails during operation, the other is used in place of the failed region. Thus, the life of semiconductor laser devices can be prolonged relative to the conventional device shown in FIG. 1 in which each light-emitting element 8 includes only one light-emitting region 1.

The semiconductor laser device shown in FIG. 2(a) has the following structure. Respective light-emitting elements 11 are disposed on single p-type InP substrate 2. Each light-emitting element 11 includes two centrally located spaced, parallel grooves 12 formed in the top surface of substrate 2. Further, each element 11 includes, over the entire top surface of substrate 2, except grooves 12, n-type InP blocking layers 13 (designated 13a and 13b for respective light-emitting regions 1 of each element 11) and p-type InP blocking layers 14 (designated 14a and 14b for respective regions 1) successively grown. P-type InP lower cladding layers 15 (15a, 15b) and InGaAsP active layers of light-emitting regions 1 (1a, 1b), are disposed in grooves 12. N-type InP upper cladding layers 16 (16a, 16b) and n-type InGaAsP contact layers 17 (17a, 17b) are sequentially grown over p-type InP blocking layers 14a, 14b and InGaAsP active layers 1a, 1b.

As shown in FIG. 2(a), an insulating region 5 separating adjacent light-emitting regions is disposed between two light-emitting regions 1a, 1b of each light-emitting element 11, and an insulating region 6 separating adjacent light-emitting elements is disposed at a boundary 7 between two adjacent elements 11. Insulating regions 5 and 6 extend along the direction of grooves 12 and also extend in the depth direction through contact layers 17, upper cladding layers 16, p-type blocking layers 14, and n-type blocking layers 13 into substrate 2. Active layer insulating region 5 and light-emitting element insulating region 6 are of, for example, SiO$_2$, SiN or photosensitive polyimide.

As shown in FIG. 2(a), on top of each light-emitting element 11, p-side electrodes 4a and 4b (4) are disposed for respective light-emitting regions 1a and 1b, and an n-side electrode 3 common to all of light-emitting elements 11 is disposed on the bottom surface of substrate 2.

As shown in FIG. 2(b), p-side electrodes 4a and 4b comprise straight portions 18a and 18b, respectively, extending in the direction of light-emitting regions 1a and 1b, and rectangular wire bonding regions 19a and 19b joined to straight portions 18a and 18b, respectively. Wires (not shown) may be bonded to respective ones of two bonding regions 19a and 19b, or a wire may be bonded to only one of bonding regions for one of light-emitting regions 1a and 1b exhibiting better light-emitting characteristics.

Examples of dimensions of respective portions are as follows. The spacing A (see FIG. 2(a)) between two light-emitting regions 1a and 1b of each light-emitting element 11 is about 30 μm. With this spacing, when an optical fiber (not shown) including a core having a diameter of, for example, 40 μm is disposed in front of each light-emitting element 11, light emitted from either one of two light-emitting regions 1a and 1b can enter into and travel through the same core. Thus, if it is desired to use a semiconductor laser device with an optical fiber having a core of, for example, 10 μm diameter, the spacing A between light-emitting regions 1a and 1b may be less than 10 μm.

Thickness B of the light-emitting element 11 is about 100 μm, the width (see FIG. 2(b)) is about 300 μm, and the length is about 300 μm. Examples of dimensions of p-side electrodes 4a and 4b are also shown in μm in FIG. 2(b). The width of the groove 5 is about 10 μm, the width of the narrow parts of the electrodes 18a and 18b is about 20 μm, and the width of the wide parts of the electrodes 19a and 19b is about 95 μm more than the widths of the electrodes 18a and 18b. The wider parts of the electrodes 19a and 19b are about 100 μm long.

In operation, a forward bias is applied between the p-side electrode 4 for a desired one of light-emitting regions 1a and 1b and n-side electrode 3. For example, if region 1a is to be driven to emit light, a forward bias is applied between p-side electrode 4a and n-side electrode 4. As shown in FIG. 2(a), since active layer insulating region 5 is disposed to extend into substrate 2 so that two active light-emitting regions 1a and 1b are electrically separated, no electrical interference will occur between two regions 1a and 1b in the same light-emitting element 11. Furthermore, light-emitting element separating insulating region 6 which extends into substrate 2 prevents electrical interference between adjacent light-emitting elements 11.

A second embodiment of the present invention is described with reference to FIGS. 3(a) and 3(b). What is different from the embodiment shown in FIG. 2 is that while in the first embodiment, the two light-emitting regions are centrally located in each element, two light-emitting regions 1a and 1b of each light-emitting element 20 are displaced to one side, the left side in the illustrated embodiment, of each light-emitting element 20. As in the first embodiment, an active layer separation insulating region 5 is disposed between light-emitting regions 1a and 1b which are spaced from each other by, for example, about 30 μm as in the first embodiment. Examples of distance of a respective one of light-emitting regions 1a and 1b from the boundary between that element and an adjacent light-emitting element 20 are also shown in FIG. 3(a).

Figure 3A:
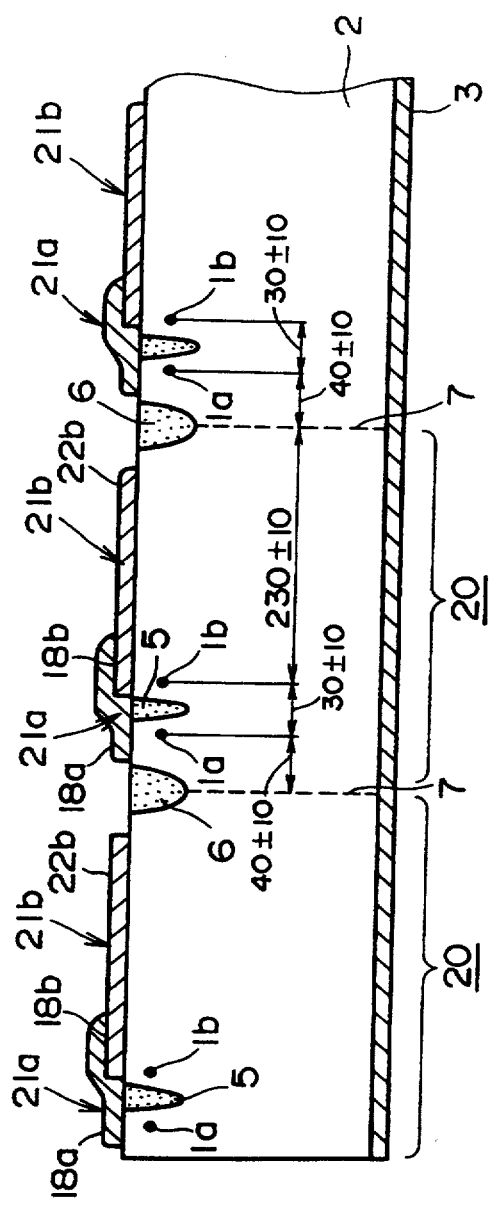
FIGS. 3(a) and 3(b) are cross-sectional and plan views, respectively, of a semiconductor laser device according to a second embodiment of the present invention.
Figure 3B:
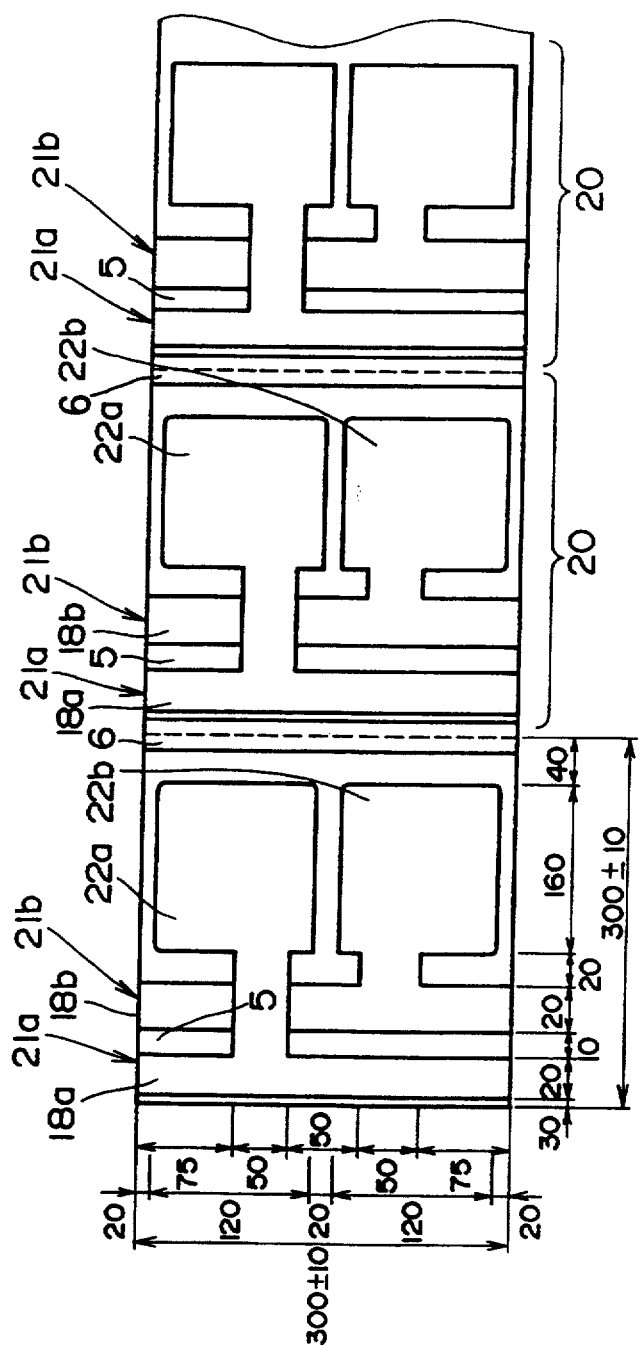

As shown in FIG. 3(a), p-side electrodes 21a and 21b for respective ones of light-emitting regions 1a and 1b, include straight portions 18a and 18b, which extend along and parallel to each other in the left side of each element 20, and wire bonding regions 22a and 22b, respective, which are joined by respective connecting portions to straight portions 18a and 18b. Dimensions of each of wire bonding regions 22a and 22b are, for example, about 160 μm wide and about 120 μm long as shown in FIG. 3(b).

In the semiconductor laser device according to the second embodiment, straight portions 18a and 18b of p-side electrodes 21a and 21b are located on the left edge of each light-emitting element 20. Accordingly, the top surface area where wire bonding regions 22a and 22b are disposed is not divided into two parts. Consequently, wire bonding regions 22a and 22b can have such a shape that the ratio of width to length is unity, and, at the same time, it becomes possible to utilize as large an area of the top surface as possible for wire bonding regions 22a and 22b. In other words, the respective wire bonding regions 22a and 22b are substantially square, as shown in FIG. 3(b), having a width of, for example, 160 μm and a length of, for example, 120 μm. In contrast, wire bonding regions 19a and 19b of the first embodiment shown in FIG. 2 are approximately square, and their width and length are 95 μm and 100 μm, respectively. It is seen that wire bonding regions 22a and 22b have larger dimensions than wire bonding regions 19a and 19b and can occupy a larger area of the top surface of each light-emitting element 20. This enables the use of a wire bonding machine of less precision than the one which may be used for the first embodiment. In other words, the number of rejects which would be produced during the bonding step can be made smaller than in the first embodiment.

It should be noted that in the first embodiment, as shown in FIG. 2(b), although the maximum length of each wire bonding region 19a, 19b can be about 300 μm, the width cannot be greater than 95 μm. Even if the length can be large, it is not possible to use a less precision bonding machine if the width cannot be made large.

The remaining portions of the laser device according to the second embodiment shown in FIG. 3 are identical similar to the corresponding portions of the device shown in FIG. 2, and, therefore, they are not explained further.

Figure 4:
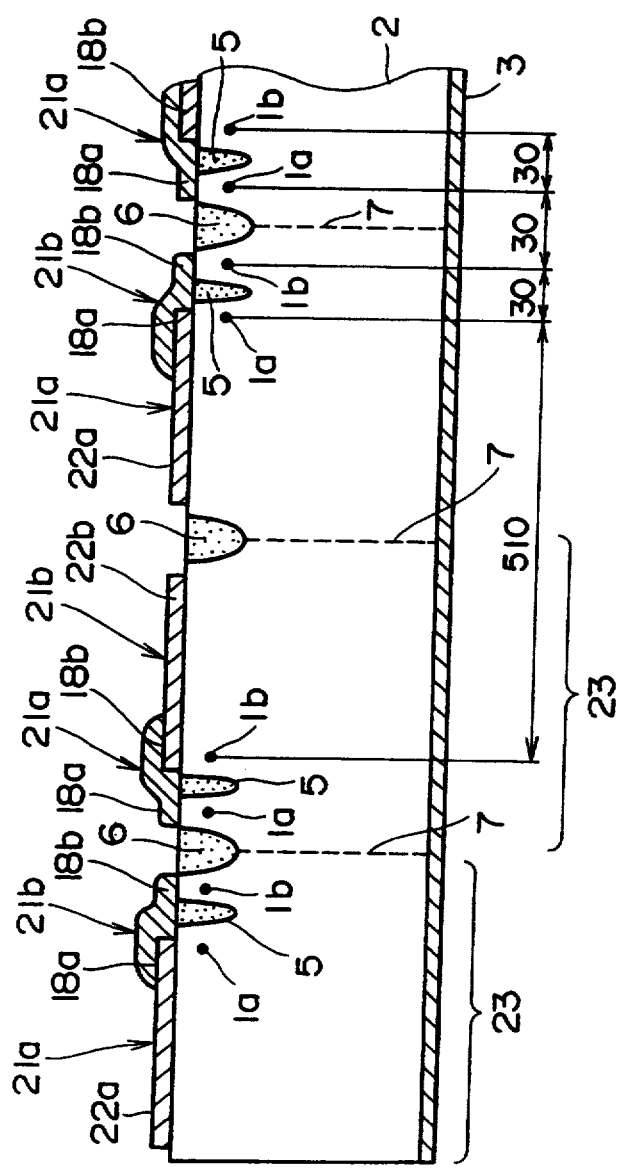
FIG. 4 is a cross-sectional view of a semiconductor laser device according to a third embodiment of the present invention.

A third embodiment is shown in FIG. 4. According to this embodiment, two adjacent two light-emitting elements 23 are paired, and the light-emitting region (1a , 1b ) of each element 23 is disposed close to boundary 7 with the adjacent element 23 of the pair. Thus, as shown in FIG. 4, two light-emitting elements 23 of one pair are formed symmetrical with respect to boundary 7 therebetween. Four light-emitting regions 1a, 1b of adjacent light-emitting elements 23 are spaced from respective adjacent regions by 30 μm, for example.

Figure 10:
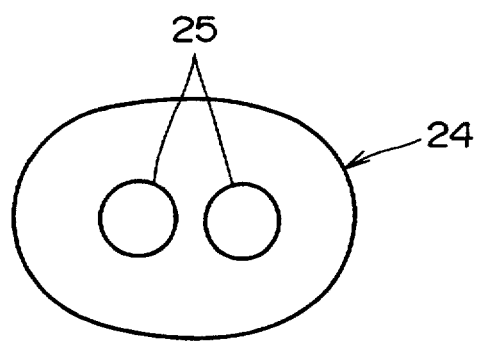
FIG. 10 shows an end surface of an optical fiber which may be used with the semiconductor laser device according to the third or eighth embodiment.

In use, one optical fiber 24 shown in FIG. 10 is assigned to one pair of light-emitting elements 23. As shown in FIG. 10, the optical fiber includes two cores 25. The spacing between four adjacent light-emitting regions is determined such that the end surface of one of cores 25 can face two light-emitting regions 1a and 1b of one of a pair of light-emitting elements 23, while the other of cores 25 can face to two light-emitting regions 1a and 1b of the other element 23. The spacing between two regions 1a and 1b of each element 23 is smaller than the diameter of core 25. The optical fiber system is operated by driving either one of two light-emitting regions 1a and 1b of each light-emitting element 23.

The number of optical fibers can be about one half the number necessary for the conventional device shown in FIG. 1, since one optical fiber is sufficient for a pair of light-emitting elements 23. Furthermore, as in the first embodiment, if one of two light-emitting regions 1a and 1b is defective, the other one can be used. Although not shown, the shape of p-side electrodes 21a and 21b is substantially the same as that of p-side electrodes 21a and 21b of the second embodiment shown in FIG. 3(b). Thus, a bonding machine of less precision than used for the first embodiment can be used.

The remaining portions of the semiconductor laser device shown in FIG. 4 are similar to those of the device of the first embodiment shown in FIG. 2, and the device of FIG. 4 operates in a similar manner to the device of FIG. 2. Accordingly, explanations of those structures and their operation are not repeated.

Figure 5:
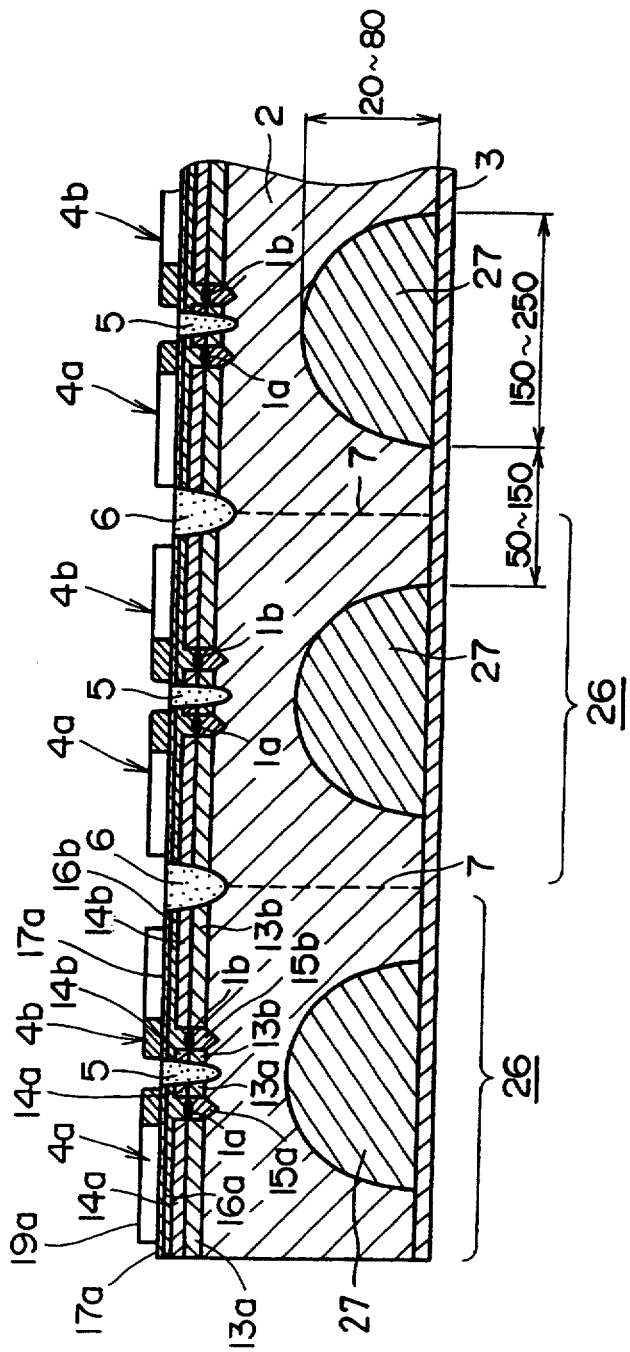
FIG. 5 is a cross-sectional view of a semiconductor laser device according to a fourth embodiment of the present invention.

FIG. 5 shows a fourth embodiment. The semiconductor laser device of FIG. 5 comprises a semiconductor laser device similar to that shown in FIG. 2, with a heat sink 27 for each light-emitting element 26. A recess is formed in the bottom surface of substrate 2 at a location beneath each light-emitting element 26, and a heat sink 27 is disposed in each recess. Each heat sink 27 extends in the same direction as active layer 1 (i.e. in the direction perpendicular to the plane of the paper of FIG. 5), and, as shown in FIG. 5, the cross-section is substantially semi-circular. Each heat sink 27 is formed of, for example, Au, Ag, Ni, Al, Cu or the like. Examples of respective heat sink dimensions are 150 to 250 μm in length, separations of 50 to 150 μm between adjacent heat sinks, and thicknesses of about 20 to 80 μm.

Heat generated by light-emitting regions 1a, 1b is efficiently dissipated through heat sink 27 located beneath them. This prevents heat generated by one light-emitting region from being transferred to light-emitting regions of an adjacent element 26. Therefore light-emitting elements 26 of FIG. 5 are not thermally affected by each other, and, therefore, the light-emitting characteristics of respective light-emitting regions can be held stable.

Figure 6:
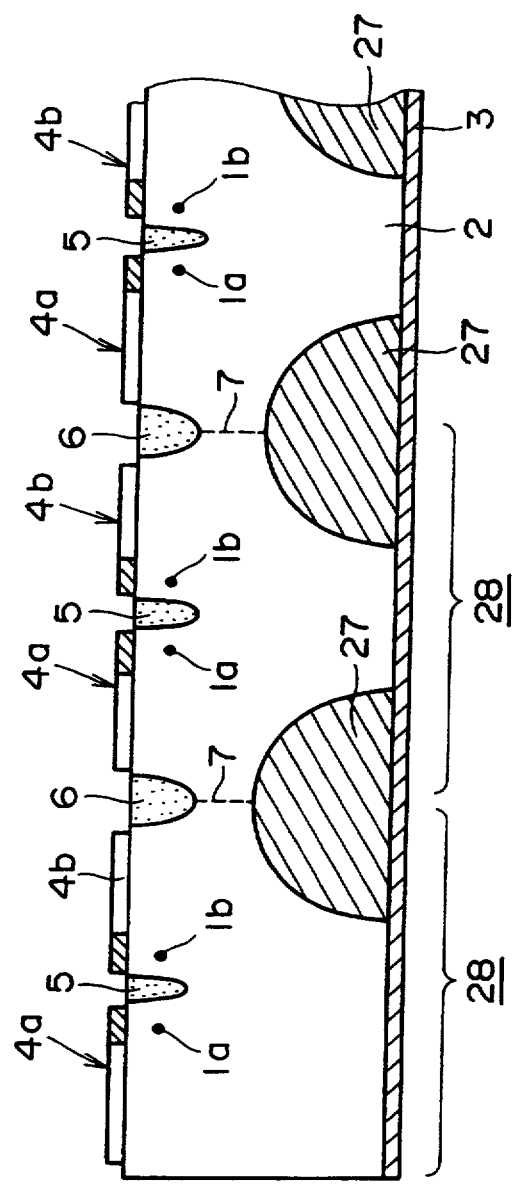
FIG. 6 is a cross-sectional view of a semiconductor laser device according to a fifth embodiment of the present invention.

A fifth embodiment of the invention is described with reference to FIG. 6. The semiconductor laser device of this embodiment comprises a semiconductor laser device similar to the one shown in FIG. 2 and a heat sink 27 disposed at each boundary 7 between two adjacent light-emitting elements 28. A recess is formed in the bottom surface of substrate 2 at each boundary 7 between two adjacent light-emitting elements 28, and a heat sink 27 is disposed in each recess. The dimensions and material of heat sinks 27 may be the same as those or the fourth embodiment shown in FIG. 5. Heat sinks 27 extend in the same direction as the active layers 1.

Figure 7:
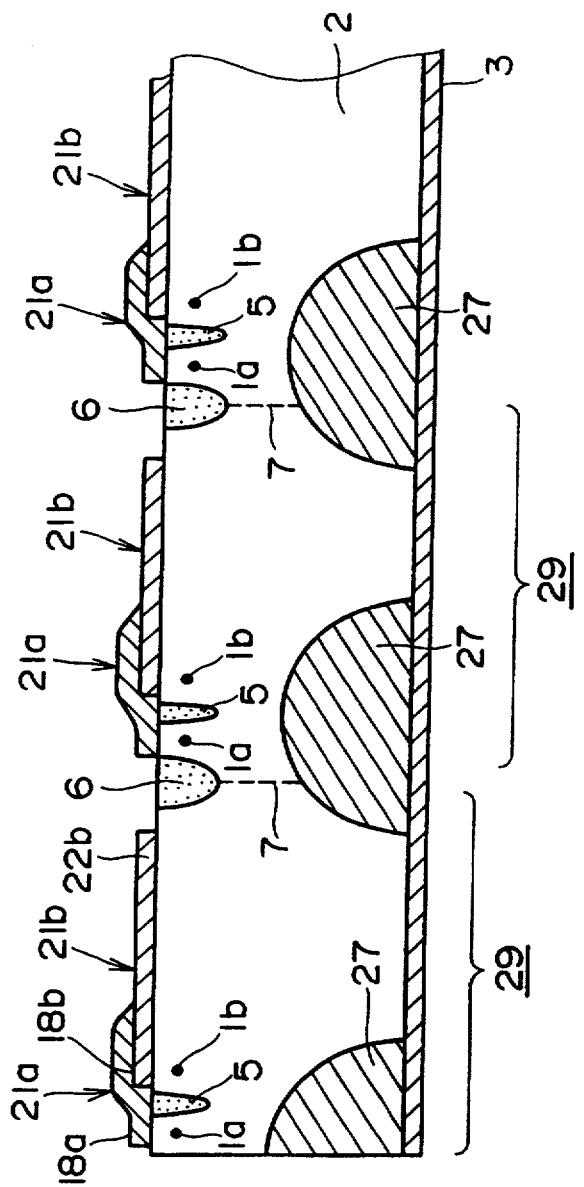
FIG. 7 is a cross-sectional view of a semiconductor laser device according to a sixth embodiment of the present invention.

A sixth embodiment of the invention is described with reference to FIG. 7. As shown in FIG. 7, the semiconductor laser device according to this embodiment comprises a device similar to the one shown in FIG. 3, and a heat sink 27 disposed beneath light-emitting regions of each light-emitting element 29. A recess is formed in the bottom surface of the substrate 2 at a location beneath the light-emitting regions 1a, 1b of each element 29, and a heat sink 27 is disposed in that recess. The dimensions and material for the heat sinks 27 may be the same as those of the heat sinks 27 of the device according to the fourth embodiment shown in FIG. 5. The heat sinks 27 extend in the direction along the active layers 1. The heat sinks dissipate heat generated by the light-emitting regions when they are operating, to thereby maintain the operating characteristics of the respective light-emitting regions stable.

The structure of the device of FIG. 7 is substantially the same as those of the device shown in FIG. 5 except for the heat sinks 27, and it operates in a manner similar to that of the device of FIG. 5. Therefore no further explanation of structure or operation is needed.

Figure 8:
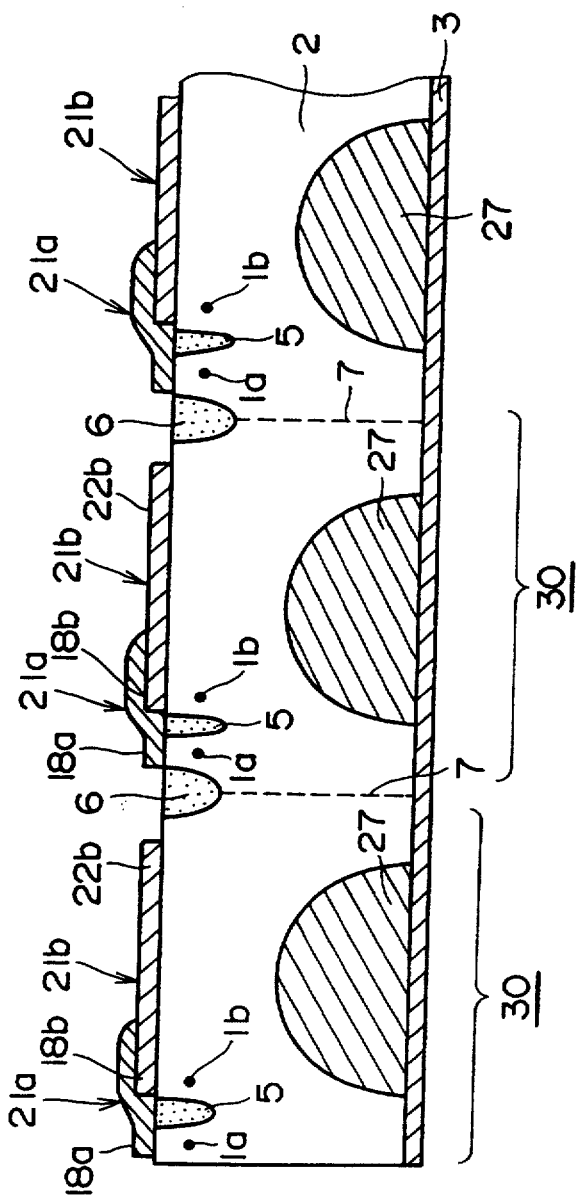
FIG. 8 is a cross-sectional view of a semiconductor laser device according to a seventh embodiment of the present invention.

FIG. 8 shows a semiconductor laser device according to a seventh embodiment of the present invention. According to this embodiment, a heat sink is provided for each of light-emitting elements of a semiconductor laser device similar to the one shown in FIG. 3, as the sixth embodiment shown in FIG. 7. However, the location of each heat sink 27 is different from that of the heat sinks 27 shown in FIG. 7. A heat sink 27 of FIG. 8 is disposed in a recess which is formed in the bottom surface of a substrate 2 at a location between two light-emitting regions 1a, 1b of each light-emitting element 30 and an adjacent light-emitting element. The dimensions and material for the heat sinks 27 may be the same as those of the heat sinks shown in FIG. 5. The heat sinks 27 extend in the same direction as the active layers 1.

According to the seventh embodiment, heat generated by light-emitting regions 1a, 1b and transferred to locations between adjacent two sets of regions 1a, 1b is dissipated efficiently by the heat sinks 27. Thus, substantially no heat generated by light-emitting regions 1a, 1b of respective light-emitting elements 30 is transferred to respective adjacent ones of light-emitting elements 30 so that the operating characteristics of the respective light-emitting regions are maintained stable.

The structure of the semiconductor laser device of FIG. 8 is similar to that of the device shown in FIG. 3, except for the heat sinks 27, and it can operate in a similar manner to the device of FIG. 3. Accordingly, no further explanation of the structure or operation is needed.

Figure 9:
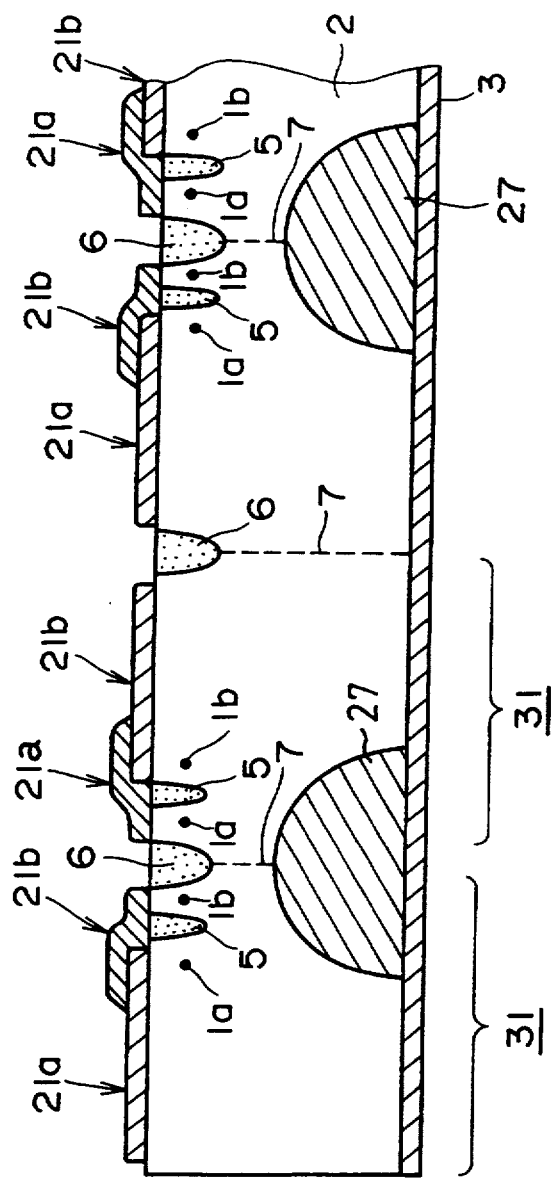
FIG. 9 is a cross-sectional view of a semiconductor laser device according to a eighth embodiment of the present invention.

A semiconductor laser device according to an eighth embodiment of the present invention is shown in FIG. 9. The semiconductor laser device of this embodiment comprises a semiconductor laser device similar to the one shown in FIG. 4, and a heat sinks 27 is provided for each pair of adjacent light-emitting elements 31. A recess is formed in the bottom surface of a substrate 2 at a location beneath four light-emitting regions 1a, 1b of each pair of light-emitting elements 31 disposed close to the boundary 7 between that pair, and a heat sink 27 is disposed in that recess. The dimensions and material of the heat sink can be the same as those of the heat sinks shown in FIG. 5. Similar heat sinks are disposed at the respective boundaries 7 between respective pairs of light-emitting elements 31. The heat sinks 27 extend in the same direction as the active layers 1.

Since each heat sink 27 is disposed beneath four light-emitting regions of each pair of adjacent light-emitting elements 31, it can efficiently dissipate heat generated by light-emitting regions 1a, 1b when they are operating, so that the operating characteristics of the respective light-emitting regions 1a, 1b can be maintained stable.

The semiconductor laser device of this embodiment has substantially the same structure as the device shown in FIG. 4, except for the heat sinks 27, and operates in a similar manner to the device of FIG. 4. Accordingly, no further explanation is needed.

The present invention has been described to have two light-emitting regions in each light-emitting element, but each light-emitting element may include therein three or more light-emitting regions. In such a case, too, the largest distance between light-emitting regions must be smaller than the diameter of one core of an optical fiber with which the semiconductor laser device is used. An insulating region similar to the region 5 of the first embodiment shown in FIG. 2 is disposed between adjacent light-emitting regions of the same light-emitting element to insulate them from each other.

In case three or more light-emitting regions are provided for each light-emitting element in the second, third, sixth, seventh and eighth embodiments respectively shown in FIGS. 3, 4, 7, 8 and 9, the same number of wire bonding regions for p-side electrodes must be used. In this case, too, the ratio of width to length of each of the three or more wire bonding regions may be made approximately unity (1), and such wire bonding regions may cover substantially the entire top surface area corresponding to each light-emitting element.

The shape of the heat sinks are described to be substantially semi-circular, but another shape, such as a rectangle, triangle, polygon, may be employed. Furthermore, the heat sinks are described to be provided one for each light-emitting element or for each pair of light-emitting elements, but plural heat sinks may be provided for each light-emitting element or for a pair of light-emitting elements.

In addition, although the present invention has been described in terms of semiconductor laser devices, the present invention is also applicable to a light-emitting diode.

Generally, the present invention is applicable to any semiconductor light-emitting device which includes a plurality of light-emitting elements disposed on a single substrate.

Further, light-responsive sections can be any light-responsive elements besides optical fiber cores, such as photodetectors.

What is claimed is:

1. A semiconductor light-emitting device comprising a substrate and at least first and second contiguous light-emitting elements disposed on said substrate, each of said first and second light-emitting elements including first and second spaced apart light-emitting regions that can be independently driven to emit light, wherein respective distances between said first and second light-emitting regions within each of said first and second light-emitting elements are smaller than distance between said light-emitting regions of said first light emitting element and said light-emitting regions of said second light emitting element.

2. The semiconductor light-emitting device according to claim 1 wherein said first and second light-emitting regions of said first and second light-emitting elements are not centrally located within the respective first and second light-emitting elements and including a plurality of electrodes with respective wire bonding regions for the respective light-emitting regions of said first and second light-emitting elements, each wire bonding region having a width and a length, the ratio of the width to the length of each wire bonding region being substantially unity, each wire bonding region covering substantially an entire top surface of the respective light-emitting element.

3. The semiconductor light-emitting device according to claim 1 wherein said substrate includes a respective recess within each of said first and second light-emitting elements opposite the respective first and second light-emitting regions of the respective light-emitting elements and comprising a heat sink disposed in each recess.

4. The semiconductor light-emitting device according to claim 1 wherein said substrate includes a recess within said first and second light-emitting elements and comprising a heat sink disposed in each recess.

5. The semiconductor light-emitting device according to claim 2 wherein said substrate includes a respective recess within each of said first and second light-emitting elements opposite the respective first and second light-emitting regions of the respective light-emitting elements and comprising a heat sink disposed in each recess.

6. The semiconductor light-emitting device according to claim 2 wherein said substrate includes a recess within said first and second light-emitting elements and comprising a heat sink disposed in each recess.

7. A semiconductor light-emitting device comprising a substrate and at least first, second, and third contiguous light-emitting elements disposed on said substrate, each of said first, second, and third light-emitting elements including first and second spaced apart light-emitting regions that can be independently driven to emit light, wherein respective distances between said first and second light-emitting regions within each of said first, second, and third light-emitting elements are smaller than distances between said light-emitting regions of said second light-emitting element and said light-emitting regions of one of said first and third light-emitting elements.

8. The semiconductor light-emitting device according to claim 7 wherein said substrate includes a recess within two contiguous pairs of said light-emitting elements and comprising a heat sink disposed in the recess.

9. A semiconductor light-emitting device comprising a substrate, at least first and second contiguous light-emitting elements disposed on said substrate, and first, second, and third separation grooves, the first separation groove defining a boundary between said first and second light-emitting elements, the second and third separation grooves defining other boundaries of said first and second light-emitting elements, respectively, each of said first and second light-emitting elements including first and second spaced apart light-emitting regions that can be independently driven to emit light, wherein distances between said first and second light-emitting regions within each of said first and second light-emitting elements and the first separation groove are smaller than distances between said first and second light-emitting regions within the respective light-emitting elements and the second and third separation grooves.

10. The semiconductor light-emitting device according to claim 9 wherein said substrate includes a recess within said first and second light-emitting elements and comprising a heat sink disposed in the recess.

* * * * *